United States Patent [19]

Okamoto et al.

[11] 4,235,663
[45] Nov. 25, 1980

[54] METHOD OF PRODUCING A DIELECTRIC OF TWO-LAYER CONSTRUCTION

[75] Inventors: Tsutomu Okamoto; Hidemasa Tamura, both of, Yokohama, Japan

[73] Assignee: Sony Corporation, Tokyo, Japan

[21] Appl. No.: 856,269

[22] Filed: Dec. 1, 1977

[30] Foreign Application Priority Data

Dec. 3, 1976 [JP] Japan ................... 51/145866

[51] Int. Cl.³ .................................. C30B 19/04
[52] U.S. Cl. ..................... 156/624; 156/DIG. 67; 156/DIG. 79
[58] Field of Search ........... 156/624, 622, DIG. 67, 156/DIG. 79; 252/62.3 T, 62.32 B, 301.4 F; 148/1.5, 171

[56] References Cited

U.S. PATENT DOCUMENTS 4,092,208  5/1978  Brice et al. ...................... 156/624

FOREIGN PATENT DOCUMENTS 5196798  8/1976  Japan ...................... 156/DIG. 79

OTHER PUBLICATIONS

Translation of Japanese Unexamined Patent Application No. 50-130466+Application.
Journal of Applied Physics vol. 36, No. 2, 1965, Nitsche.
Translation (Supplied by Applicant) of Japanese Unexamined Patent Application No. 50-130466+Application.
Journal of Applied Physics vol. 36, No. 8, Aug. 1965, Nitsche.

Primary Examiner—Hiram H. Bernstein
Attorney, Agent, or Firm—Hill, Van Santen, Steadman, Chiara & Simpson

[57] ABSTRACT

A thin (less than 500μm) epitaxial dielectric layer having low photoconductivity is grown on a monocrystalline wafer composed of $Bi_{12}GeO_{20}$ by a liquid-phase epitaxial growth technique. The composition of the liquid melt from which the dielectric layer is grown is composed of a pseudo-three-component system defined by the formula:

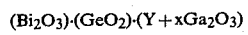

$$(Bi_2O_3) \cdot (GeO_2) \cdot (Y + xGa_2O_3)$$

wherein Y is a component selected from the group consisting of CaO, MgO, BaO, SrO and mixtures thereof and x is a numeral ranging from 0.05 to 5.0. The pseudo-three-component system is so-selected that in a ternary diagram of the three individual components, the mol ratio of $Bi_2O_3:GeO_2(Y+xGa_2O_3)$ is surrounded by a range connecting points A, B and C on such ternary diagram wherein point A is 0.760:0.002:0.238; point B is 0.994:0.002:0.004; and point C is 0.760:0.236:0.004.

15 Claims, 6 Drawing Figures

METHOD OF PRODUCING A DIELECTRIC OF TWO-LAYER CONSTRUCTION

BACKGROUND OF THE INVENTION

1. Field of the Invention

The invention relates to a method of producing a dielectric layer and somewhat more particularly to a method of producing a dielectric layer useful as a glow or a light-modulating element or display device which utilize an electro-optical effect or surface wave transmission medium.

2. Prior Art

The prior art has suggested using dielectric layers having an electro-optical effect and composed of crystalline materials, such as, for example, bismuth-silicon oxide or bismuth-germanium oxide. Such dielectric layers may be produced by the crystal pulling techniques and formed so as to have a sufficiently large area for use in electro-optical devices. However, these prior art dielectric layers exhibit a large electrical conductivity when irradiated by light or a large photoconductive effect so that the application of an electrical field onto such dielectric layer is disturbed. Further, these prior art dielectric layers have a large absorption of visible light so that optical signals transmitted therethrough may be distorted.

An electro-optical crystalline material which is low in photoconductivity and low in absorption of visible light is disclosed in Japanese Patent Application No. 29931/74 (Laid-Open Document No. 130466/1975). However, it is extremely difficult or impossible to produce such crystalline materials, which comprise bismuth-germanium oxide or bismuth-silicon oxide doped with Ga and an element selected from the group consisting of Ba, Ca, Mg and Sr with a sufficiently large area for use in electro-optical devices.

SUMMARY OF THE INVENTION

An object of the invention is to provide a novel method of producing a dielectric layer.

Another object of the invention is to provide a novel method of producing a dielectric layer which exhibits a low photoconductivity.

A further object of the invention is to provide a novel method of producing a dielectric layer which is superior in the quality of the crystalline material within such layer.

A still further object of the invention is to provide a novel method of producing a large area dielectric layer having a low photoconductivity.

A yet further object of the invention is to provide a novel method of producing a large area dielectric layer which exhibits low photoconductivity and is superior in the quality of the crystalline material with such layer.

In accordance with the principles of the invention, an exemplary embodiment of the method provided by the invention comprises producing a relatively thin dielectric layer grown on a suitable size monocrystalline substrate or wafer composed of $Bi_{12}GeO_{20}$ via the liquid-phase epitaxial growth technique. Generally, the method of the invention comprises producing a liquid melt composed of a pseudo-three-component system defined by the formula:

$$(Bi_2O_3)\cdot(GeO_2)\cdot(Y+xGa_2O_3) \quad (I)$$

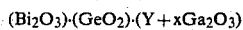

wherein Y is a material selected from the group consisting of BaO, CaO, MgO, SrO and mixtures thereof and x is a numeral ranging from 0.05 to 5.0 whereby the pseudo-three-component system is so-selected that in a ternary diagram of the three individual components, i.e., $Bi_2O_3$, $BeO_2$ and $(Y+xGa_2O_3)$, the mol ratio of such individual components is defined within a range connecting points A, B and C on such ternary diagram wherein point A is 0.760:0.002:0.238; point B is 0.994:0.002:0.004; and point C is 0.760:0.236:0.004.

Other and further objects, features, advantages and embodiments of the invention will be apparent from the following description and claims, taken in conjunction with the accompanying drawings.

DESCRIPTION OF THE PREFERRED EMBODIMENTS

The invention provides a novel method of producing a two-layer dielectric construction whereby a relatively thin electro-optical dielectric layer having low photoconductivity, low visible light absorption and extremely good crystal quality is readily attained. In accordance with the principles of the invention, a liquid melt is produced so as to be comprised of a pseudo-three-component system defined by the formula:

$$Bi_2O_3-GeO_2-(Y+xGa_2O_3)$$

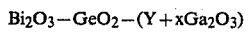

wherein Y is a material selected from the group consisting of BaO, CaO, MgO, SrO and mixtures thereof; and x is a numeral ranging from 0.05 to 5.0 so that in a ternary diagram of such a component system (shown at FIG. 1), the composition of the liquid melt is defined by the mol ratio range within a triangle made by connecting points A, B and C on such ternary diagram.

Figure 3:
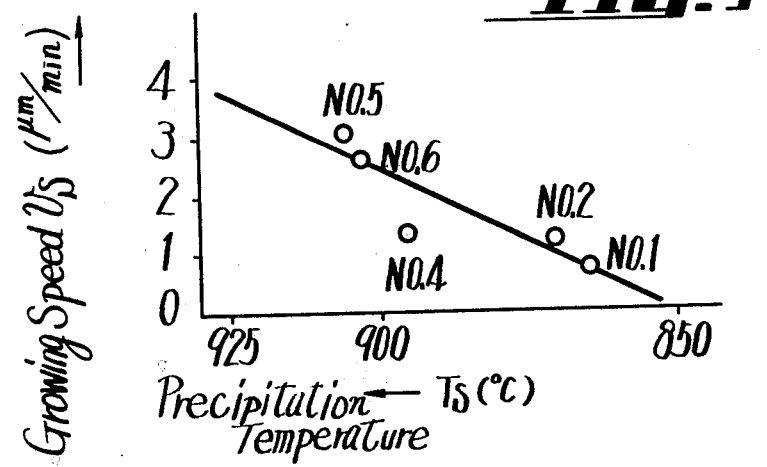
FIG. 3 is a graph illustrating the relation between a melt solidification temperature, $T_s$, and a layer growth rate, $V_s$, useful in explaining certain aspects of the invention.

The embodiments of the pseudo-three-component system of the invention utilized to generate the graph of FIG. 3 comprised embodiments wherein Y in formulation (I) above is CaO and 0.05 to 5.0 mols of $Ga_2O_3$ were added per mol of CaO.

Figure 1:
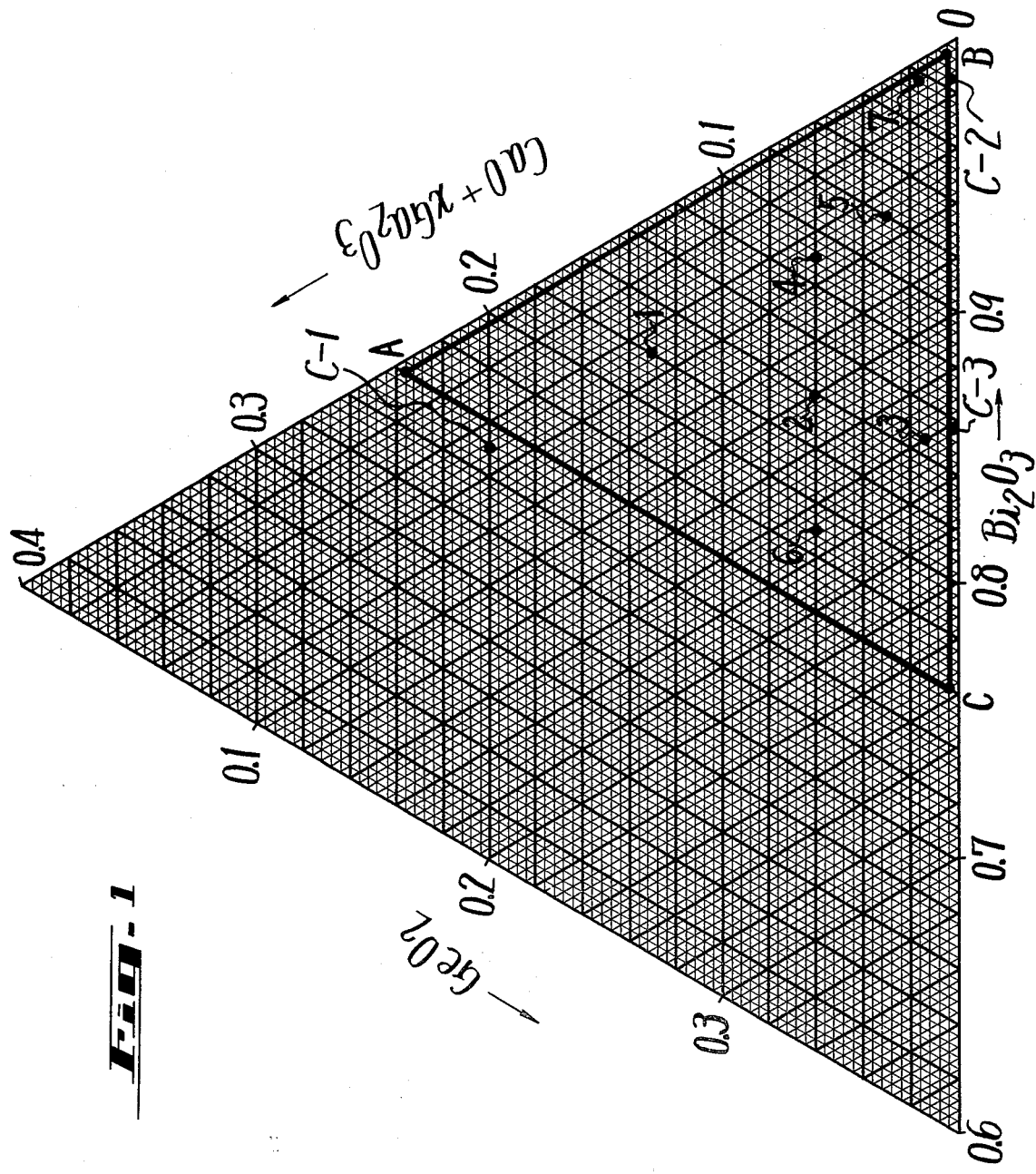
FIG. 1 is a ternary diagram showing a pseudo-three-component system of $(BiO_3)\cdot(GeO_2)\cdot(Y+xGa_2O_3)$ useful in explaining the mol range of the components within compositions used in the practice of the invention.

In the ternary graph illustrated at FIG. 1, points A, B and C encompass the mol ratio range of the respective components, $Bi_2O_3:GeO_2:(Y+xGaO_3)$ useful in the practice of the invention and such points respectively comprise 0.760:0.200:0.238, 0.994:0.002:0.004 and 0.760:0.236:0.004.

A liquid melt having the above composition is prepared by heating a select mixture of the respective components in a suitable crucible or the like and thereafter controlling the heat of the melt while substantially simultaneously contacting the melt with a select surface (i.e., one having a [100]orientation) of a monocrystalline $Bi_{12}GeO_{20}$ wafer under controlled temperature-time growth conditions sufficient to epitaxially grow a relatively thin dielectric layer onto such wafer via the liquid phase epitaxial growth technique.

As described above, the respective components within a liquid melt, i.e., $Bi_2O_3$, $GeO_3$ and $(Y+xGa_2O_3)$ are carefully selected so as to fall within the range defined by connecting points A, B and C on the ternary diagram illustrated at FIG. 1. If liquid melts having compositions within a range outside the boundary lines A–B and A–C of the triangle ABC shown in the ternary diagram of FIG. 1 are utilized in an attempt to produce a dielectric layer, a different phase appears in the thus-produced layer which does not possess the advantages of a dielectric layer made in accordance with the principles of the invention. Similarly, if liquid melts having compositions within a range outside the boundary line B–C of the triangle ABC shown in the ternary diagram of FIG. 1 are used in an attempt to make a dielectric layer, the melt solidification temperature becomes too high and layer growth rate becomes too great so that it is difficult to adequately control the thickness of a layer thus produced and/or to obtain an adequate lattice matching between the substrate and the grown layer. Accordingly, a composition selected within the triangle ABC of the ternary diagram of FIG. 1 yields dielectric layers which are low in photoconductivity and exhibit a superior lattice match between the substrate and the grown layer.

In order to attain a controlled epitaxial growth rate for a dielectric layer formed from a melt composed of the pseudo-three-component system shown in FIG. 1, it is necessary to carefully control the temperature of the melt as well as the composition of such melt, as explained above. The processing or growth temperature, $T_g$, required for epitaxial growth is somewhat below the actual solidification temperature, $T_s$, of a given melt. The difference between $T_g$ and $T_s$ of a melt is the degree or amount of supercooling $\Delta T$ required in order to achieve good epitaxial growth from the melt. This temperature relation is defined by the following relation:

$$T_g = T_s - \Delta T \quad (\text{Ii})$$

Figure 2:
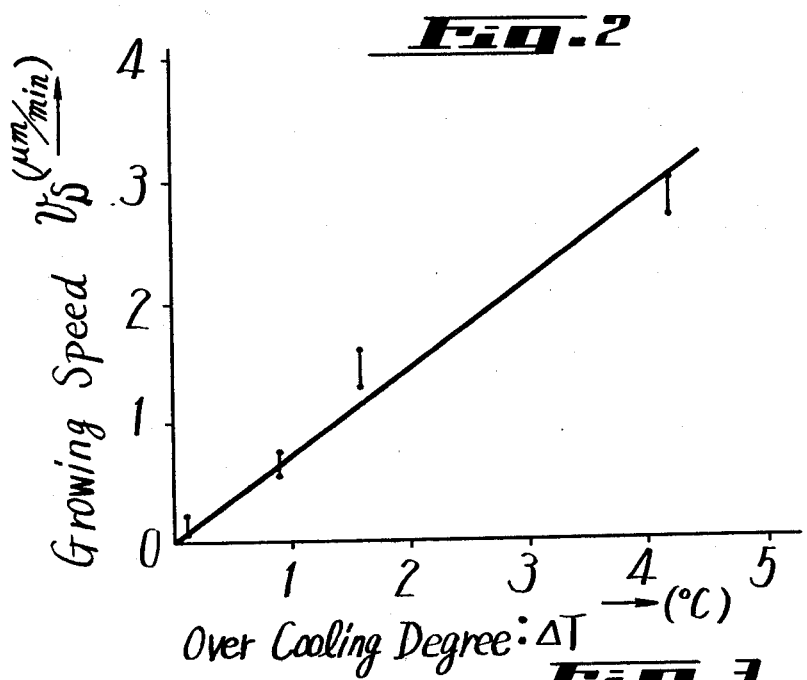
FIG. 2 is a graph showing the relation between the degree of supercooling, $\Delta T$, and a layer growth rate, $V_s$ useful in explaining certain aspects of the invention.

The relation between the degree of supercooling, $\Delta T$, and epitaxial growth speed, $V_s$, is graphically illustrated at FIG. 2. As can be seen, $V_s$ is proportional to $\Delta T$; in other words, the epitaxial growth speed increases linearly with an increasing degree of supercooling. Accordingly, proper selection of the degree of supercooling, $\Delta T$, applied to a melt provides a control parameter for attaining a desired epitaxial growth rate. For example, if an epitaxial growth rate of less than 0.2 μm/min. is selected, too much time is required to produce a useful dielectric layer and hence such slow growth rate is impractical. On the other hand, an epitaxial growth rate greater than 20 μm/min. tends to cause crystal defects to appear in the grown layer and disturb the uniformity of the epitaxial growth. Accordingly, a preferred epitaxial growth rate is in the range of about 0.2 to 20 μm/min. The degree of supercooling, $\Delta T$, to be applied to a melt in order to attain the desired growth rate ranges from about 0.2° to 50° C. and more preferably ranges from 0.5° to 30° C. If the degree of supercooling is below 0.2°, the above-noted practical growth rate cannot be attained. On the other hand, if the degree of supercooling exceeds 50° C., crystalline material precipitates from the melt and does not produce uniform epitaxial growth.

The relation between the solidification temperature, $T_s$, and the epitaxial growth rate, $V_s$, in a melt having compositions within the triangular range defined by points A, B and C of FIG. 1 is graphically shown at FIG. 3. As is apparent, the growth speed, $V_s$, increases with the solidification temperature, $T_s$. As indicated earlier, if the growth rate becomes too great, it is difficult to control crystal quality and/or the thickness of an epitaxial thin layer. On the other hand, if the solidification temperature, $T_s$, is too high, difficulties are encountered since it is necessary to insure that the $Bi_{12}GeO_{20}$ substrate does not liquefy or melt under such high temperatures. Accordingly, the melt composition (which determines the solidification temperature) must be carefully controlled.

Figure 4:
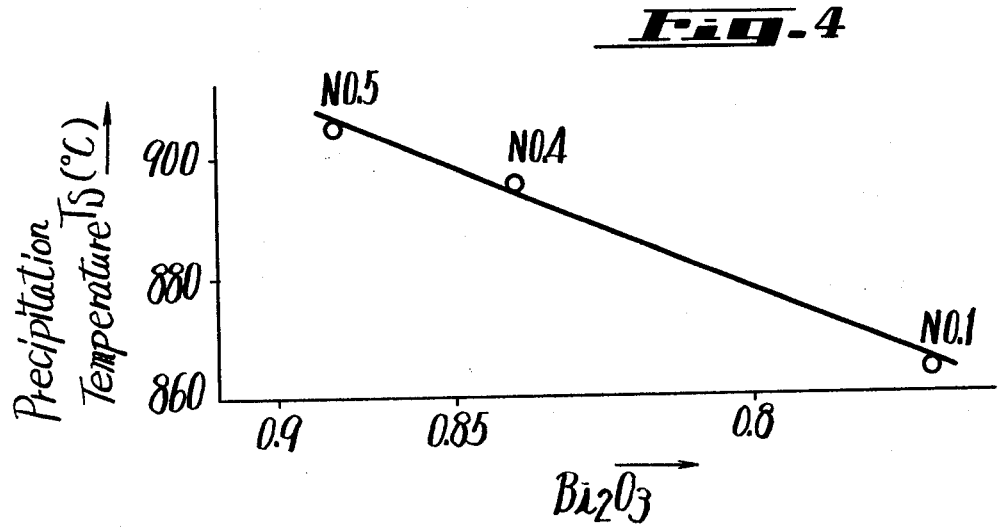
FIG. 4 is a graph showing the relation between the amount of $Bi_2O_3$ and a melt solidification temperature, $T_s$, when the amount of $GeO_2$ is maintained fixed within the pseudo-three-component system used in the practice of the invention.

FIG. 4 graphically illustrates the relation between the solidification temperature, $T_s$, and a melt composition having a fixed amount of GeO (0.05 mols) therein and varied amounts of the other two components, i.e., $Bi_2O_3$ and $(CaO+xGa_2O_3)$. As is apparent, the solidification temperature increases substantially linearly with increasing amounts of $Bi_2O_3$ within a melt. Thus, if the amount of $Bi_2O_3$ is increased too much, the solidification temperature, $T_s$, becomes too high. However, when the amount of CaO is increased too much, a different phase appears, as shown below in the Example with comparative specimen C-1.

Figure 5:
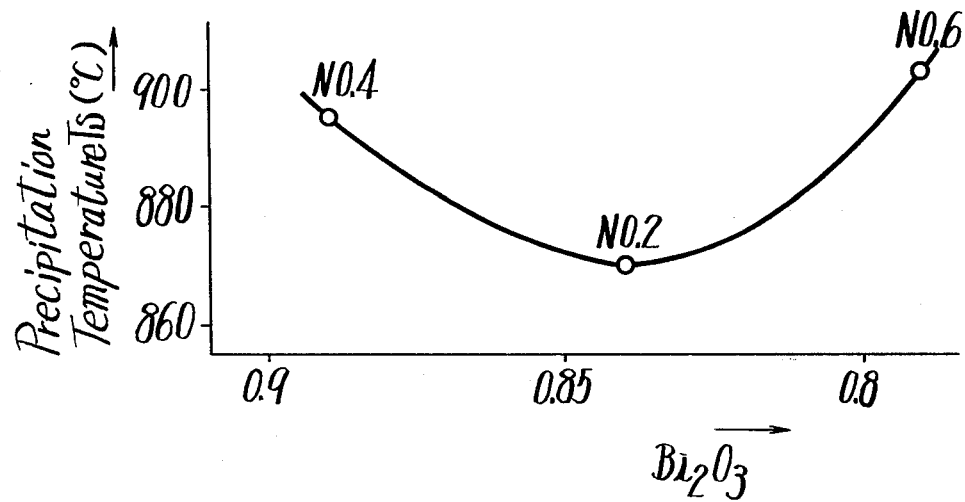
FIG. 5 is a graph showing the relation between the amount of $Bi_2O_3$ and a melt solidification temperature, $T_s$, when the amount of CaO is maintained fixed within the pseudo-three-component system used in the practice of the invention.

FIG. 5 graphically illustrates the relation between the solidification temperature, $T_s$, and a melt composition having a fixed amount of CaO (0.06 mols) therein and varied amounts of $Bi_2O_3$ and GeO. As is apparent, the solidification temperature increases in this instance even if the amount of $Bi_2O_3$ is increased or decreased. Accordingly, careful control of the melt composition so that it falls within the triangulated range defined by points A, B and C on the ternary diagram of FIG. 1 is required.

With the foregoing general discussion in mind, there is presented a detailed example which will illustrate to those skilled in the art the manner in which this invention is carried out. However, this example is not to be construed as limiting the scope of the invention in any way.

EXAMPLE

Appropriate starting materials were mixed to produce the following mol composition:

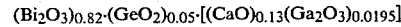

$$(Bi_2O_3)_{0.82} \cdot (GeO_2)_{0.05} \cdot [(CaO)_{0.13}(Ga_2O_3)_{0.0195}]$$

This mixture was placed in a platinum crucible having a volume of 20 cc and heated to a temperature of 920° C. At this temperature, the mixture began to liquefy and this temperature was maintained for about one hour in order to achieve a total liquefication or melting of the mixture. Thereafter, the so-attained liquid melt was gradually and controllably cooled until a solidification temperature, $T_s$, for the melt was attained, which was 860° C. This solidification temperature was measured when a solid just began appearing on the surface of the melt during a time when a monocrystalline $Bi_{12}GeO_{20}$ wafer surface having a [100]-crystal axis orientation was in contact with the melt so that the [100]-surface of the wafer was coincident with the growth direction of a layer growing onto such wafer. Once the solidification temperature was achieved, a controlled supercooling of the melt was undertaken. The amount or degree of supercooling, $\Delta T$, in this embodiment, was selected as 0.9° C. in order to attain a lower growth rate of about 0.6 μm/min. Thus, the actual growth or processing temperature, $T_g$, for epitaxial growth from this melt was selected in accordance with the temperature relation (II) stated above so that, by substituting the above values in this formulation, a growth temperature, $T_g$, of 864.1° C. was utilized (i.e., 864.1° C.=(865°−0.9°)). Accordingly, during the epitaxial growth, the liquid melt of the above composition was constantly maintained at a temperature of 864.1° C. within the heat-controlled crucible and a monocrystalline substrate or wafer composed of $Bi_{12}GeO_{20}$ having an appropriately orientated crystal axis surface was controllably immersed into such temperature-controlled liquid melt. After about 10 minutes, the $Bi_{12}GeO_{20}$ wafer was controllably pulled from the liquid melt. Upon examination, it was noted that on the orientated surface of the wafer which was in contact with the melt, a dielectric layer of good surface quality was formed. This dielectric layer had a thickness of 6 μm and, in combination with the wafer or substrate, formed a two-layer dielectric construction. On the other hand, the so-formed dielectric layer comprised an epitaxial thin layer of $Bi_{12}GeO_{20}$ doped with Ca and Ga and exhibited a surface area comparable to that of the wafer or substrate utilized. The so-produced layer was then labeled as Invention Specimen 1 and tested; pertinent data is provided in Table I below.

Similar epitaxial thin layers were produced and labeled Invention Specimens 2 through 7 with compositions identified below Table I, which also shows the respective growth temperature, $T_g$, the respective solidification temperature, $T_s$, the respective epitaxial growth rate, $V_s$, the respective degree of supercooling, $\Delta T$, the respective ratio of $V_s$ to $\Delta T$, and the current value I exhibited by each specimen layer via photoconductivity when light was irradiated on the respective specimen layers.

Table I also shows similar data for Invention Specimens 8 through 10, which are of similar composition, except that MgO, BaO and SrO, respectively, were utilized in place of CaO. The specific formulations for specimen layers 8 through 10 are identified after Table I. Further, Table I shows similar data for comparative specimen layers C-1 through C-3, which were prepared in a manner substantially as outlined above, but from melt compositions outside the compositions useful in the practice of the invention.

Figure 6:
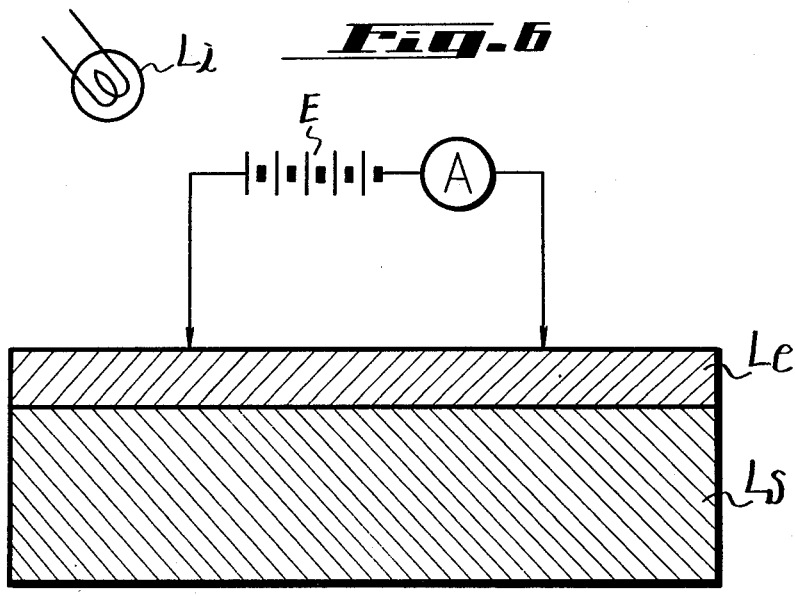
FIG. 6 is a somewhat schematic illustration of a device useful for measuring photoconductivity of plate-shaped dielectric layers produced in accordance with the principles of the invention.

The apparatus utilized to test the current value, I, of each respective specimen layer is schematically illustrated at FIG. 6. Generally, the current value, I, was measured by a meter A when an incandescent lamp $L_i$ produced light which irradiated onto an epitaxial thin layer $L_e$ formed on a substrate $L_s$ while a 270 V DC voltage was applied from a voltage source E onto the layer $L_e$ between two points on a surface thereof spaced apart 2 mm.

The compositions of the respective Invention Specimen layers 1 through 7 correspond to points 1-7 on the ternary diagram of FIG. 1 and the compositions of the respective comparative specimen layers C-1 through C-3 correspond to points C-1, C-2 and C-3 on the ternary diagram of FIG. 1.

TABLE I

| Invention Specimens & Comparisons Specimens No. | $T_G$ (°C.) | $T_s$ (°C.) | $\Delta T$ (°C.) | $V_s$ (μm/min) | $V_s/\Delta T$ | I(A) |
|---|---|---|---|---|---|---|
| 1 | 864.1 | 865 | 0.9 | 0.6 | 0.67 | $1.8 \times 10^{-11}$ |
| 2 | 869 | 870 | 1.0 | 1.25 | 1.25 | $1.6 \times 10^{-11}$ |
| 3 | 938 | 939 | 1.0 | 7.0 | 7.0 | $1. \times 10^{-12}$ |
| 4 | 894 | 895 | 1.0 | 1.35 | 1.35 | $1.1 \times 10^{-10}$ |
| 5 | 905 | 906 | 1.0 | 3.0 | 3.0 | $2.3 \times 10^{-11}$ |
| 6 | 902 | 903 | 1.0 | 2.6 | 2.6 | $2.1 \times 10^{-12}$ |
| 7 | 866 | 867 | 1.0 | 0.2 | 0.2 | $3 \times 10^{-10}$ |
| 8 | 887 | 888 | 1.0 | 0.2 | 0.2 | $4 \times 10^{-10}$ |
| 9 | 879 | 880 | 1.0 | 0.2 | 0.2 | $6 \times 10^{-10}$ |
| 10 | 844 | 845 | 1.0 | 0.2 | 0.3 | $5 \times 10^{-10}$ |
| C-1 | no epitaxial growth due to precipitation of different phase | | | | | |
| C-2 | 896 | 897 | 1.0 | 2.1 | 2.1 | $8 \times 10^{-9}$ |
| C-3 | — | 930 | — | — | — | $5 \times 10^{-8}$ |

Composition No.
1 $(Bi_2O_3)_{0.82} \cdot (GeO_2)_{0.05} \cdot (CaO \cdot 0.15Ga_2O_3)_{0.13}$
2 $(Bi_2O_3)_{0.84} \cdot (GeO_2)_{0.16} \cdot (CaO \cdot 0.15Ga_2O_3)_{0.06}$
3 $(Bi_2O_3)_{0.845} \cdot (GeO_2)_{0.141} \cdot (CaO \cdot 0.15Ga_2O_3)_{0.014}$
4 $(Bi_2O_3)_{0.89} \cdot (GeO_2)_{0.05} \cdot (CaO \cdot 0.15Ga_2O_3)_{0.06}$
5 $(Bi_2O_3)_{0.92} \cdot (GeO_2)_{0.05} \cdot (CaO \cdot 0.15Ga_2O_3)_{0.03}$
6 $(Bi_2O_3)_{0.79} \cdot (GeO_2)_{0.15} \cdot (CaO \cdot 0.15Ga_2O_3)_{0.06}$
7 $(Bi_2O_3)_{0.978} \cdot (GeO_2)_{0.007} \cdot (CaO \cdot 0.15Ga_2O_3)_{0.015}$
8 $(Bi_2O_3)_{0.978} \cdot (GeO_2)_{0.007} \cdot (MgO \cdot 0.15Ga_2O_3)_{0.015}$
9 $(Bi_2O_3)_{0.978} \cdot (GeO_2)_{0.007} \cdot (BaO \cdot 0.15Ga_2O_3)_{0.015}$
10 $(Bi_2O_3)_{0.978} \cdot (GeO_2)_{0.007} \cdot (SrO \cdot 0.15Ga_2O_3)_{0.015}$
C-1 $(Bi_2O_3)_{0.75} \cdot (GeO_2)_{0.05} \cdot (CaO \cdot 0.15Ga_2O_3)_{0.20}$
C-2 $(Bi_2O_3)_{0.984} \cdot (GeO_2)_{0.015} \cdot (CaO \cdot 0.15Ga_2O_3)_{0.001}$
C-3 $(Bi_2O_3)_{0.857} \cdot (GeO_2)_{0.143}$ As can be seen from the foregoing data, comparative specimen layer C-1 contains a different phase so that no epitaxial layer was attained; comparative specimen layer C-2 exhibited a photoconductivity which was too high and thus was unsuitable for the invention. Comparative specimen layer C-3 was composed of a bismuth-germanium oxide with no dopant.

The data in Table I indicates that the current value I of the respective Inventive Specimen layers produced in accordance with the principles of the invention, when such layers are irradiated with a light, are considerably lower or suppressed when compared with the current value exhibited by comparative specimen layer C-3, which did not contain compound Y of the invention and was undoped. However, when these values are compared with those exhibited by comparative specimen C-2, which contains an extremely low amount of CaO therein, the difference between the respective current values is on the order of about 1 magnitude. This may be due to the fact that an insufficient amount of CaO in the melt produces insufficient amounts of CaO in the solid layer so that the photoconductivity of such layer is too high. This is a reason why the compositions of the invention are selected within the triangular range determined by points A, B and C on the ternary diagram of FIG. 1 and shows how the boundary B-C in such diagram is attained.

On the other hand, the boundaries A-B and A-C of the ABC triangle in FIG. 1 are based on the fact that, as described earlier, in consideration of the data exhibited by comparative specimen C-1, epitaxial growth is impossible with compounds outside these boundaries because of the precipitation of a different phase crystalline material.

The reason why the mol amount of $Ga_2O_3$ added to CaO in the practice of the invention is in the range of 0.05 to 5.0 is that with this range, a dielectric thin layer having a sufficiently low photoconductivity, low visible light absorption and superior crystal quality is attained. It is to be noted that if too much $Ga_2O_3$ is present in a melt composition, an increase in photoconductivity results and it is difficult to grow high quality dielectric layers. On the other hand, if an insufficient amount of $Ga_2O_3$ is present in a melt composition, an increase in absorption of visible light occurs.

With epitaxial thin layers made in accordance with the method of the invention, it was ascertained that in instances where the amount of Ca was within the preferred range, the nonconformity of the lattice constants of the grown layer to $Bi_{12}GeO_{20}$ was about $10^{-5}$ as determined by powder x-ray diffraction. Even in embodiments where MgO, BaO, SrO or mixtures thereof are utilized as Y, the amount of such materials contained in the crystalline is very small so that, similar to embodiments containing Ca, the non-conformity of the resultant lattice constants is relatively low and also the photoconductivity thereof is sufficiently low, for example, as shown in Invention Specimen layers 8-10 in Table I above.

The thin epitaxial dielectric layers produced in accordance with the invention have a thickness in the range of about 20 to 500 $\mu m$. The lower limit is selected for reasons of fragility to thermal shock and because extremely thin layers exhibit a reduction of photoconductivity while the upper thickness limit is selected so as to avoid accumulation of lattice defects, surface unevenness and the apprehension of including bubbles or other foreign matter in the epitaxial layer.

By proceeding in accordance with the principles of the invention, a dielectric thin layer can be produced which is low in photoconductivity, exhibits low absorption of visible light and has superior crystalline quality. Further, since such dielectric thin layer is epitaxially grown on a select surface of an available substrate, which can be of any size desired, such dielectric layer can be produced with a sufficiently large area to use with various devices, such as display apparatus, etc.

In summation, the invention provides a method of producing a dielectric layer on a substance via liquid epitaxial growth technique and comprises:

(a) Providing a liquid melt composed of a psuedo-three-component system defined by the formula:

$$(Bi_2O_3)\cdot(GeO_2)\cdot(Y+xGaO_3)$$

wherein Y is a material selected from the group consisting of BaO, CaO, MgO, SrO and mixtures thereof and x is a numeral ranging from 0.05 to 5.0 so that such liquid melt has a mol ratio of such components within a ternary diagram of such three components which is surrounded by a range connecting points A, B and C on such diagram wherein point A is 0.760:0.002:0.238; point B is 0.994:0.002:0.004; and point C is 0.760:0.236:0.004;

(b) Selectively supercooling such melt to a temperature below the solidification temperature of said melt and substantially simultaneously contacting said melt with a select surface of a monocrystalline substrate composed of $Bi_{12}GeO_{20}$ and maintaining such supercooling temperature while a desired thickness of an epitaxial layer grows at a select rate from said melt onto said surface; and (c) Pulling said substrate away from said melt.

In preferred embodiments of the invention, the degree of supercooling ranges from about 0.2° to 50° C. below the solidification temperature of the melt utilized and more preferably, ranges from about 0.5° to 30° C. below the solidification temperature of such melt. Further, in preferred embodiments of the invention, the surface of the substrate which is brought into contact with the melt has a preferred crystalline orientation, such as a [100]-crystalline axis orientation so that epitaxial growth occurs in the so-select direction. Yet further, the epitaxial growth rate is preferably selected so as to range from about 0.2 to 20 $\mu m/min$.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. A method of producing a dielectric layer on a substrate comprising:

(a) providing a liquid melt composed of a pseudo-three-component system defined by the formula:

$$(Bi_2O_3)\cdot(GeO_2)\cdot(Y+xGeO_3)$$

wherein Y is a material selected from the group consisting of BaO, CaO, MgO, SrO and mixtures thereof and x is a numeral ranging from 0.5 to 5.0 so that such liquid melt has a mol ratio of such components within a ternary diagram of said three components which is surrounded by a range connecting points A, B and C on such diagram wherein point A is 0.760:0.002:0.238; point B is 0.994:0.002:0.004; and point C is 0.760:0.236:0.004;

(b) selectively supercooling such melt to a temperature about 0.2° to 50° C. below the solidification temperature of said melt and substantially simultaneously contacting said melt with a select surface of a monocrystalline substrate compound of $Bi_{12}GeO_{20}$ and maintaining such supercooling temperature while a desired thickness of an epitaxial layer grows at a select rate from said melt onto said surface; and (c) pulling said substrate away from said melt.

2. A method as defined in claim 1 wherein the degree of supercooling ranges from about 0.5° to 30° C. below the solidification temperature of said melt.

3. A method as defined in claim 1 wherein said select surface of the monocrystalline substrate contacted with said melt has a preferred crystalline axis orientation.

4. A method as defined in claim 3 wherein said crystalline axis orientation is a [100]-crystalline axis orientation.

5. A method as defined in claim 1 wherein the epitaxial growth rate is selected so as to range from about 0.2 to 20 $\mu m/min$.

6. A method as defined in claim 1 wherein said liquid melt is composed of $(Bi_2O_3)_{0.82} \cdot (GeO_2)_{0.05} \cdot (CaO \cdot 0.15Ga_2O_3)_{0.13}$.

7. A method as defined in claim 1 wherein said liquid melt is composed of $(Bi_2O_3)_{0.84} \cdot (GeO_2)_{0.16} \cdot (CaO \cdot 0.15Ga_2O_3)_{0.06}$.

8. A method as defined in claim 1 wherein said liquid melt is composed of $(Bi_2O_3)_{0.845} \cdot (GeO_2)_{0.141} \cdot (CaO \cdot 0.15Ga_2O_3)_{0.014}$.

9. A method as defined in claim 1 wherein said liquid melt is composed of $(Bi_2O_3)_{0.89} \cdot (GeO_2)_{0.05} \cdot (CaO \cdot 0.15Ga_2O_3)_{0.06}$.

10. A method as defined in claim 1 wherein said liquid melt is composed of $(Bi_2O_3)_{0.92} \cdot (GeO_2)_{0.05} \cdot (CaO \cdot 0.15Ga_2O_3)_{0.03}$.

11. A method as defined in claim 1 wherein said liquid melt is composed of $(Bi_2O_3)_{0.79} \cdot (GeO_2)_{0.15} \cdot (CaO \cdot 0.15Ga_2O_3)_{0.06}$.

12. A method as defined in claim 1 wherein said liquid melt is composed of $(Bi_2O_3)_{0.978} \cdot (GeO_2)_{0.007} \cdot (CaO \cdot 0.15Ga_2O_3)_{0.015}$.

13. A method as defined in claim 1 wherein said liquid melt is composed of $(Bi_2O_3)_{0.978} \cdot (GeO_2)_{0.007} \cdot (MgO \cdot 0.15Ga_2O_3)_{0.015}$.

14. A method as defined in claim 1 wherein said liquid melt is composed of $(Bi_2O_3)_{0.978} \cdot (GeO_2)_{0.007} \cdot (BaO \cdot 0.15Ga_2O_3)_{0.015}$.

15. A method as defined in claim 1 wherein said liquid melt is composed of $(Bi_2O_3)_{0.978} \cdot (GeO_2)_{0.007} \cdot (SrO \cdot 0.15Ga_2O_3)_{0.015}$.

* * * * *